(12) United States Patent
Lu et al.

(10) Patent No.: US 12,224,008 B2
(45) Date of Patent: Feb. 11, 2025

(54) NON-VOLATILE STATIC RANDOM ACCESS MEMORY

(71) Applicant: NATIONAL CHENG KUNG UNIVERSITY, Tainan (TW)

(72) Inventors: Darsen Duane Lu, Tainan (TW); Mohammed Aftab Baig, Tainan (TW); Siao-Shan Huang, Tainan (TW); Fu Yuan Chang, Tainan (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 154 days.

(21) Appl. No.: 18/087,279

(22) Filed: Dec. 22, 2022

(65) Prior Publication Data

US 2024/0170062 A1  May 23, 2024

(30) Foreign Application Priority Data

Nov. 21, 2022  (TW) .................................. 111144382

(51) Int. Cl.
*G11C 11/22* (2006.01)
*G06F 3/06* (2006.01)
*G11C 14/00* (2006.01)

(52) U.S. Cl.
CPC ........ *G11C 14/0072* (2013.01); *G06F 3/0613* (2013.01); *G06F 3/0625* (2013.01); *G06F 3/0629* (2013.01); *G06F 3/0673* (2013.01)

(58) Field of Classification Search
CPC . G11C 14/0072; G06F 3/0613; G06F 3/0625; G06F 3/0629; G06F 3/0673

USPC .......................................................... 365/145
See application file for complete search history.

(56) References Cited

U.S. PATENT DOCUMENTS

| | | | |
|---|---|---|---|
| 10,049,740 B2 * | 8/2018 | Sugahara | G11C 14/0081 |
| 10,325,647 B2 * | 6/2019 | Sakhare | G11C 14/009 |
| 10,622,070 B2 * | 4/2020 | Chen | G11C 11/2275 |
| 10,885,980 B2 * | 1/2021 | Chen | G11C 11/2273 |
| 11,475,941 B2 * | 10/2022 | Jaiswal | G11C 11/419 |
| 2006/0023503 A1 * | 2/2006 | Lee | G11C 14/00 365/185.05 |
| 2018/0033486 A1 * | 2/2018 | Chen | G11C 11/2275 |
| 2023/0326518 A1 * | 10/2023 | Wang | H10B 10/12 |
| 2024/0005977 A1 * | 1/2024 | Li | G11C 7/1006 |

FOREIGN PATENT DOCUMENTS

| | | | |
|---|---|---|---|
| JP | 2008016120 A | * | 1/2008 |
| JP | 2013062319 A | * | 4/2013 |

\* cited by examiner

*Primary Examiner* — Viet Q Nguyen
(74) *Attorney, Agent, or Firm* — Maschoff Brennan (57) ABSTRACT

A non-volatile static random access memory includes: a static random access memory, a reading element and a first embedded non-volatile memory. The static random access memory includes a first inverter, a second inverter and two transistors, an output terminal of the first inverter and the input terminal of the second inverter are electrically connected to each other to serve as a Q node, an input terminal of the first inverter and an output terminal of the second inverter are electrically connected to each other to serve as a QB node, and the two transistors are electrically connected to the Q node and the QB node, respectively. The reading element is electrically connected to the Q node. The first embedded non-volatile memory is electrically connected to the QB node.

6 Claims, 11 Drawing Sheets

NON-VOLATILE STATIC RANDOM ACCESS MEMORY

CROSS-REFERENCE TO RELATED APPLICATIONS

This non-provisional application claims priority under 35 U.S.C. § 119(a) on Patent Application No(s). 111144382 filed in Republic of China (ROC) on Nov. 21, 2022, the entire contents of which are hereby incorporated by reference.

BACKGROUND

1. Technical Field

This disclosure relates to a non-volatile static random access memory.

2. Related Art

Von-Neumann structure involves transferring data from a memory to a processor for performing data processing and calculations by the processor. However, transferring data from the memory to the processor and vice versa increases power consumption and is a time-consuming process known as a von-Neumann bottleneck. Static random access memory (SRAM) cells is developed into an efficient way to implement in-memory computing (CIM) operations. However, such operations are usually intermittent and increase static power consumption.

SUMMARY

Accordingly, this disclosure provides a non-volatile static random access memory.

According to one or more embodiment of this disclosure, a non-volatile static random access memory includes: a static random access memory, a reading element and a first embedded non-volatile memory. The static random access memory includes a first inverter, a second inverter and two transistors, an output terminal of the first inverter and the input terminal of the second inverter are electrically connected to each other to serve as a Q node, an input terminal of the first inverter and the output terminal of the second inverter are electrically connected to each other to serve as a QB node, and the two transistors are electrically connected to the Q node and the QB node, respectively. The reading element is electrically connected to the Q node. The first embedded non-volatile memory is electrically connected to the QB node.

In view of the above description, by electrically connecting at least one embedded non-volatile memory (eNVM) to the static random access memory, the non-volatile static random access memory according to one or more embodiments of the present disclosure may store, restore and perform calculations on data in real time, may realize in-memory computing, and non-volatile characteristics may be realized. Therefore, the non-volatile static random access memory may be prevented from encountering the von Neumann bottleneck situation, and intermittent static power consumption of computing devices may be lowered. In addition, by giving excitation to the terminal of the eNVM connecting the plate line, data may be stored instantly from the SRAM cell to the eNVM device before turning off the supply voltage from the PWR (power) line of the SRAM. Data is restored back to the SRAM cell from the eNVM device by turning on the supply voltage on the PWR line and restoring the plate line voltage to the initial value. Since data storage and data restoration are performed instantly, static power consumption and memory writing time are reduced.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. According to the description, claims and the drawings disclosed in the specification, one skilled in the art may easily understand the concepts and features of the present invention. The following embodiments further illustrate various aspects of the present invention, but are not meant to limit the scope of the present invention.

Figure 1:
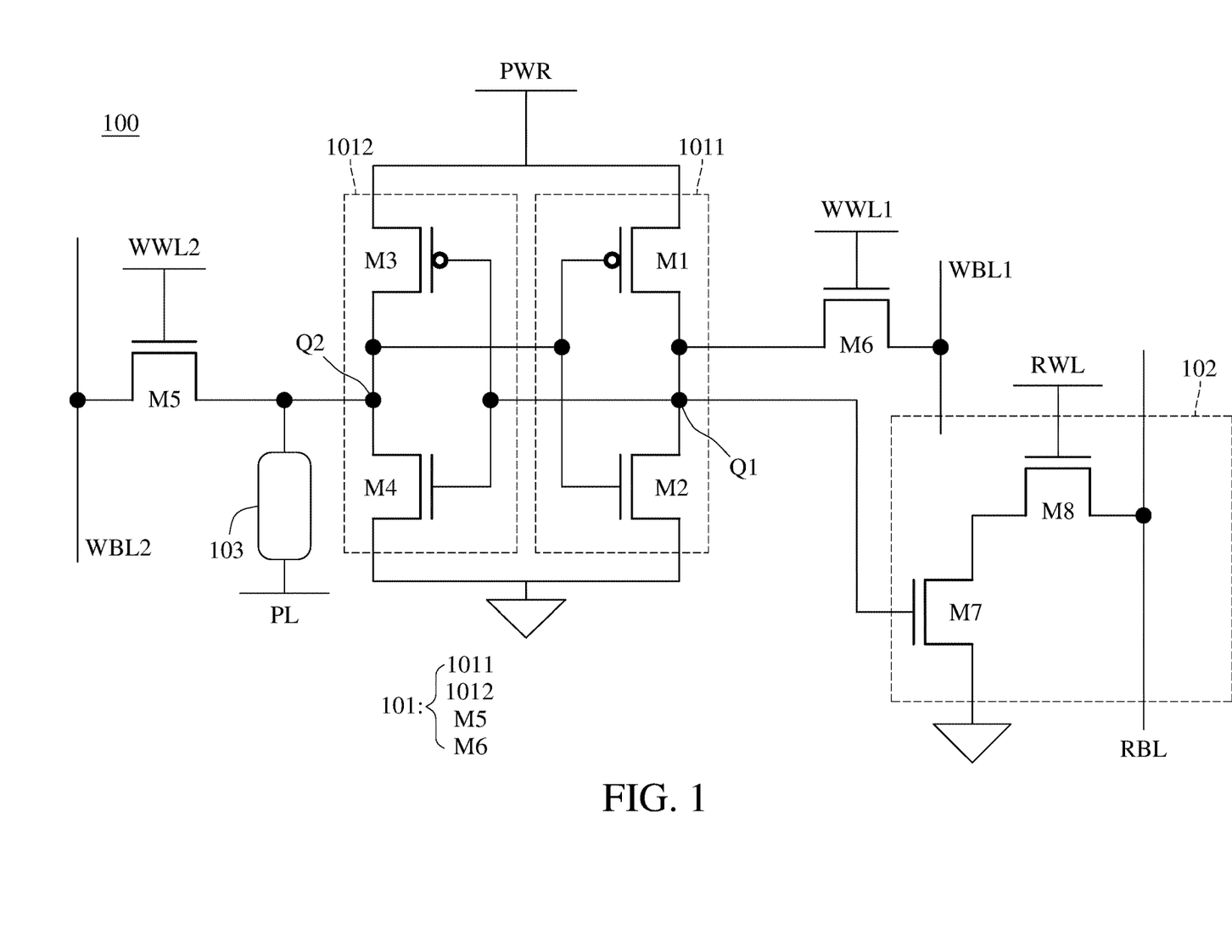
FIG. 1 is a structural circuit diagram illustrating a non-volatile static random access memory according to a first embodiment of the present disclosure.

Please refer to FIG. 1, FIG. 1 is a structural circuit diagram illustrating a non-volatile static random access memory according to a first embodiment of the present disclosure. As shown in FIG. 1, the non-volatile static random access memory 100 according to the first embodiment of the present disclosure includes a static random access memory 101, a reading element 102 and an embedded non-volatile memory (eNVM)103.

The static random access memory 101 has a structure of six transistors-static random access memory. The static random access memory 101 may be a latch circuit, and include a first inverter 1011, a second inverter 1012 and two transistors M5 and M6. An output terminal of the first inverter 1011 and an input terminal of the second inverter 1012 are electrically connected to each other to serve as a Q node Q1, and an input terminal of the first inverter 1011 and an output terminal of the second inverter 1012 are electrically connected to each other to serve as a the QB node Q2. In short, the Q node Q1 and the QB node Q2 may be a storage node of the static random access memory 101. The reading element 102 is electrically connected to the Q node Q1, and the eNVM 103 is electrically connected to the QB node Q2.

Further, as shown in FIG. 1, the first inverter 1011 includes a first transistor M1 and a second transistor M2. A gate electrode of the first transistor M1 and a gate electrode of the second transistor M2 are electrically connected to each other to serve as an input terminal of the first inverter 1011, a drain electrode of the first transistor M1 is electrically connected to a drain electrode of the second transistor M2 to serve as an output terminal of the first inverter 1011. A source electrode of the first transistor M1 is electrically connected to a power line PWR, and a source electrode of the second transistor M2 is grounded.

The second inverter 1012 includes a third transistor M3 and a fourth transistor M4. A gate electrode of the third transistor M3 and a gate electrode of the fourth transistor M4 are electrically connected to each other to serve as an input terminal of the second inverter 1012, a drain electrode of the third transistor M3 is electrically connected to a drain electrode of the fourth transistor M4 to serve as an output terminal of the second inverter 1012. A source electrode of the third transistor M3 is electrically connected to the power line PWR, and a source electrode of the fourth transistor M4 is grounded.

In addition, a fifth transistor M5 and a sixth transistor M6 are electrically connected to the Q node Q1 and the QB node Q2, respectively. In detail, a gate electrode of the fifth transistor M5 is electrically connected to the second write word line WWL2, a source electrode of the fifth transistor M5 is electrically connected to a second write bit line WBL2, a drain electrode of the fifth transistor M5 is electrically connected to the QB node Q2. A gate electrode of the sixth transistor M6 is electrically connected to a first write word line WWL1, a source electrode of the sixth transistor M6 is electrically connected to the first write bit line WBL1, and a drain electrode of the sixth transistor M6 is electrically connected to the Q node Q1.

The reading element 102 may include a first reading transistor M7 and a second reading transistor M8. A gate electrode of the first reading transistor M7 is electrically connected to the Q node Q1, a drain electrode of the first reading transistor M7 is electrically connected to a source electrode of the second reading transistor M8, and a source electrode of the first reading transistor M7 is grounded. A gate electrode of the second reading transistor M8 is electrically connected to a read word line RWL, a drain electrode of the second reading transistor M8 is electrically connected to a read bit line RBL.

The eNVM 103 may be a ferroelectric capacitor (Fecap) etc., the present disclosure is not limited thereto.

It should be noted that, among the eight transistors of the non-volatile static random access memory 100, the first transistor M1 and the third transistor M3 may be P-metal-oxide-semiconductor field-effect transistors (PMOS), and the second transistor M2, the fourth transistor M4, the fifth transistor M5, the sixth transistor M6, the first reading transistor M7 and the second reading transistor M8 may be N-metal-oxide-semiconductor field-effect transistors (NMOS).

In an embodiment, the fifth transistor M5, the sixth transistor M6, the first reading transistor M7 and the second reading transistor M8 may also be PMOS; and in this embodiment, the source electrode of the first reading transistor M7 is electrically connected to a terminal supplying a working voltage (Vdd), and a terminal of each one of the first write word line WWL1, the second write word line WWL2, the first write bit line WBL1, the second write bit line WBL2, the read word line RWL and the read bit line RBL grounded in the embodiment of NMOS is modified to be connected to the terminal supplying the working voltage, and a terminal of each one of the first write word line WWL1, the second write word line WWL2, the first write bit line WBL1, the second write bit line WBL2, the read word line RWL and the read bit line RBL connected to the terminal supplying the working voltage in the embodiment of NMOS is modified to be grounded.

The static random access memory 101 may be further electrically connected to a plate line PL, for the plate line PL to control the voltage received by the eNVM 103. In other words, a terminal of the eNVM 103 is electrically connected to the QB node Q2, and the other terminal of the eNVM 103 is electrically connected to the plate line PL.

By electrically connecting the eNVM 103 to the static random access memory 101, the non-volatile static random access memory 100 may have the function of storage, restoration and performing immediate data calculation, and may realize in-memory computing and non-volatile characteristics. Therefore, the non-volatile static random access memory 100 may be prevented from encountering the von Neumann bottleneck situation, and intermittent static power consumption of computing devices may be lowered. Further, by giving excitation to the terminal of the eNVM 103 connecting the plate line PL, data may be stored instantly from the SRAM cell 101 to the eNVM device before turning off the supply voltage from the PWR (power) line of the SRAM cell 101. Data is restored back to the SRAM cell 101 from the eNVM 103 by turning on the supply voltage on the PWR line of the SRAM cell 101 and restoring the plate line PL voltage as earlier. Since data storage and data restoration are performed in parallel, static power consumption and memory writing time are reduced.

It should be noted that, the following embodiments of the non-volatile static random access memory described with reference to FIG. 2 to FIG. 8 also include the static random access memory, the reading element and the eNVM, and the static random access memory of each embodiment may be the same as the static random access memory 101 of the non-volatile static random access memory 100 shown in FIG. 1. Therefore, to avoid repeated descriptions unnecessarily obscuring the focus of the embodiments of FIG. 2 to FIG. 8, the following descriptions of FIG. 2 to FIG. 8 focus on the differences between the embodiments, and does not repeat the detail description of the static random access memory 101.

Figure 2:
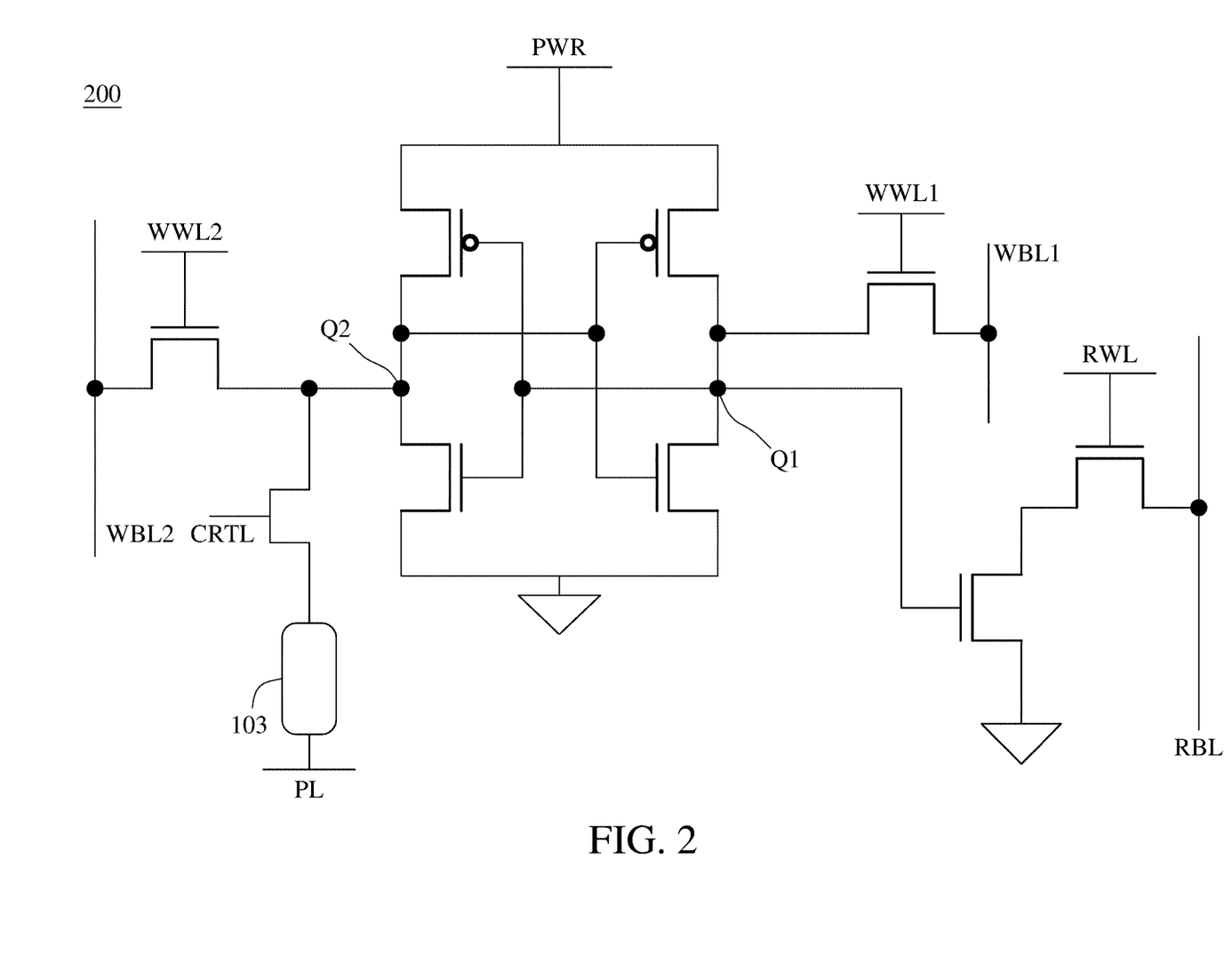
FIG. 2 is a structural circuit diagram illustrating a non-volatile static random access memory according to a second embodiment of the present disclosure.

Please refer to FIG. 2, wherein FIG. 2 is a structural circuit diagram illustrating a non-volatile static random access memory according to a second embodiment of the present disclosure. The non-volatile static random access memory 200 shown in FIG. 2 further includes a control transistor CTRL, and the eNVM 103 is electrically connected to the QB node Q2 through the control transistor CTRL.

The control transistor CTRL is configured to control a connection between the eNVM 103 and the static random access memory 101, thereby improving the reliability of the eNVM 103. Specifically, before the static random access memory 101 is turned off, data stored in the static random access memory 101 is written into the eNVM 103 through the control of the control transistor CTRL, to lower the static power leakage. After successfully writing data into the eNVM 103, the supply voltage on the power PWR line may be driven to low level power to shut down power. Data is restored from the eNVM 103 by turning on the supply voltage on the PWR line to Vdd and applying the bias on the plate line PL to a voltage prior to writing the data to the eNVM 103. In addition, the connection between the SRAM cell 101 and eNVM 103 is made and broken using the control transistors CTRL.

Figure 3:
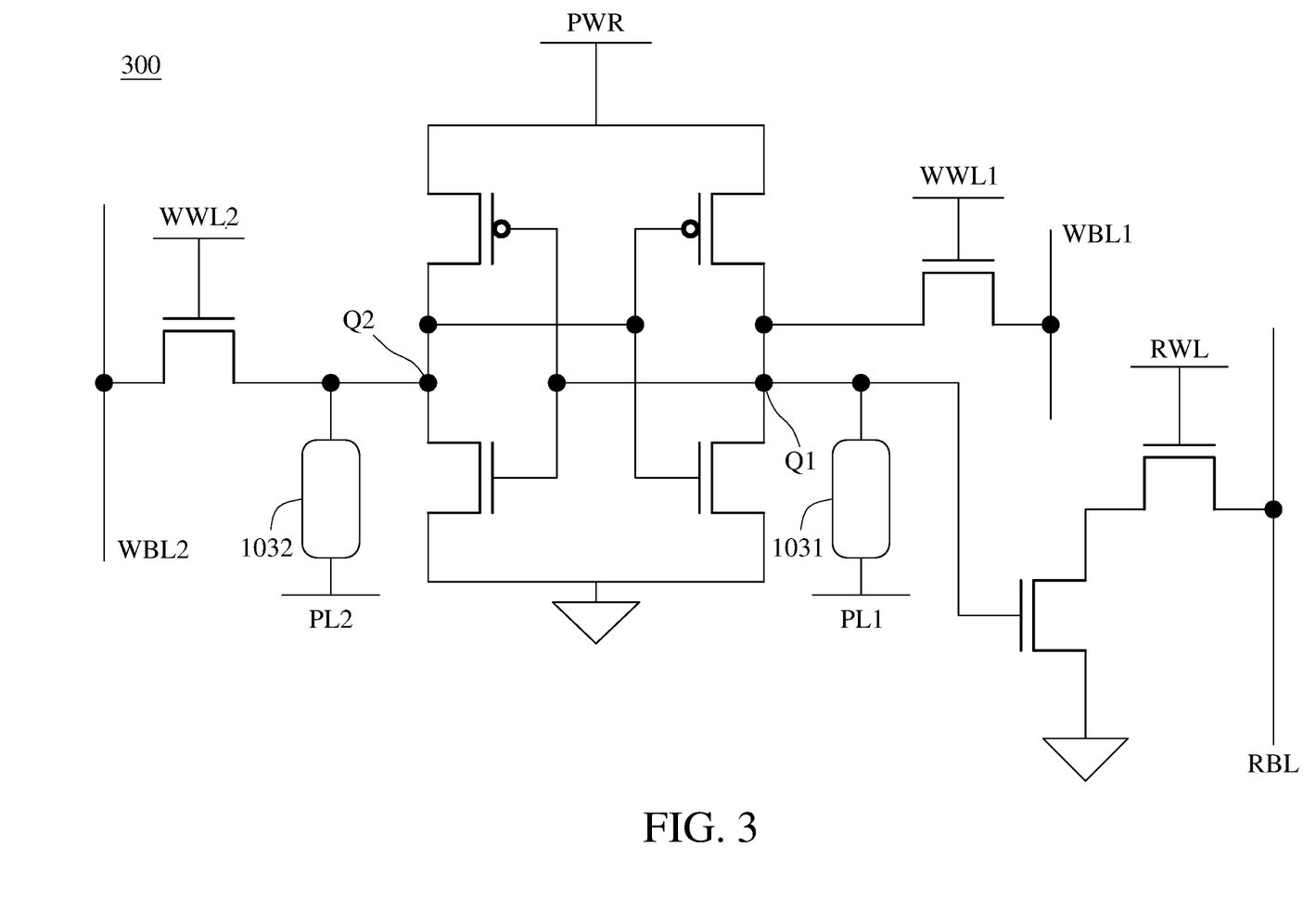
FIG. 3 is a structural circuit diagram illustrating a non-volatile static random access memory according to a third embodiment of the present disclosure.

Please refer to FIG. 3, wherein FIG. 3 is a structural circuit diagram illustrating a non-volatile static random access memory according to a third embodiment of the present disclosure. The non-volatile static random access memory 300 shown in FIG. 3 includes a first eNVM 1031 and a second eNVM 1032, wherein the first eNVM 1031 and the second eNVM 1032 may be ferroelectric capacitors, and the first eNVM 1031 and the second eNVM 1032 are preferably implemented with the same type of the non-volatile memory. The first eNVM 1031 is directly electrically connected to the Q node Q1 and a first plate line PL1, and the second eNVM 1032 is directly electrically connected to the QB node Q2 and a second plate line PL2. By the structure shown in FIG. 3, in-memory computing and non-volatile characteristics may be realized.

Figure 4:
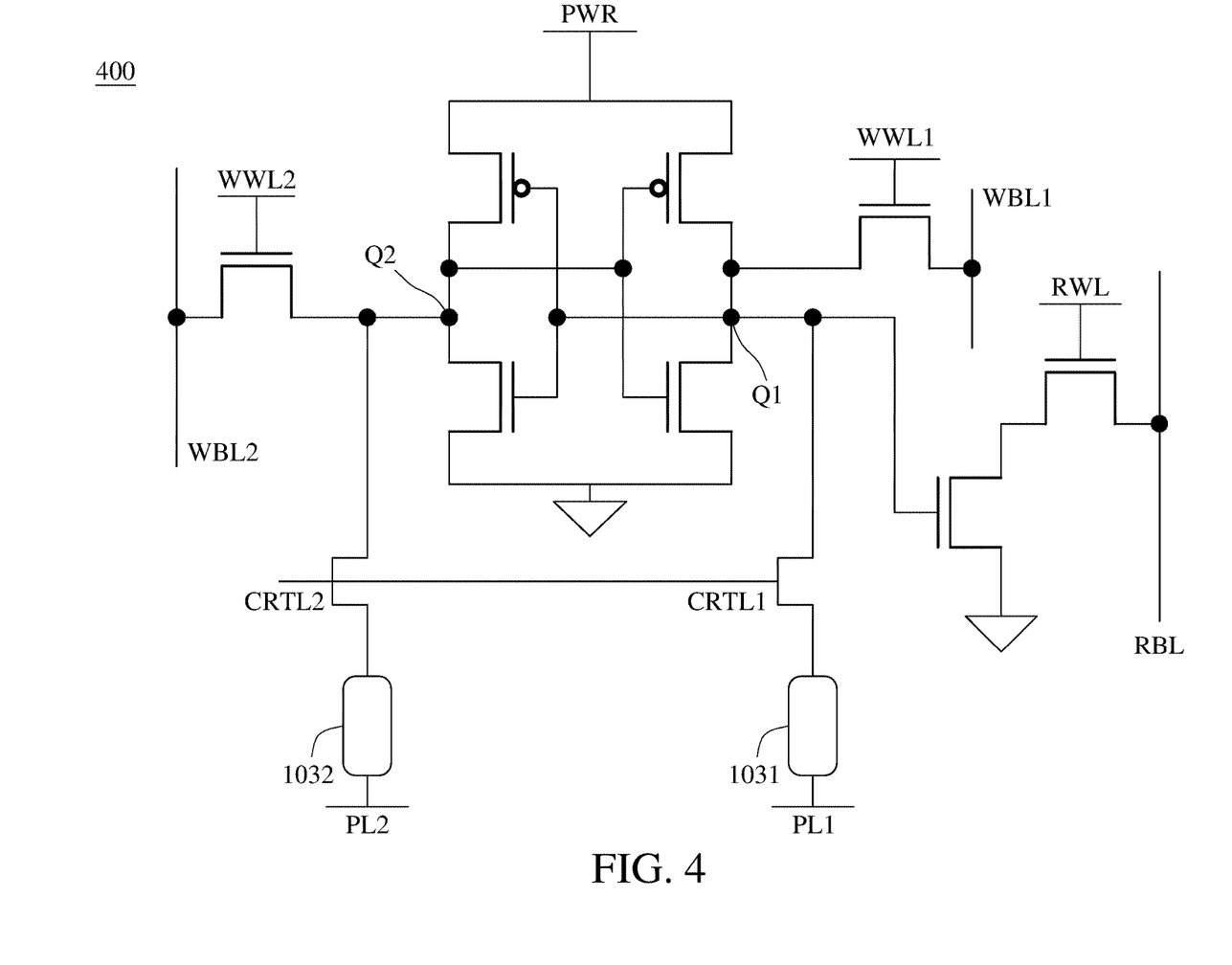
FIG. 4 is a structural circuit diagram illustrating a non-volatile static random access memory according to a fourth embodiment of the present disclosure.

Please refer to FIG. 4, wherein FIG. 4 is a structural circuit diagram illustrating a non-volatile static random access memory according to a fourth embodiment of the present disclosure. The eNVM of the non-volatile static random access memory 400 shown in FIG. 4 includes the first eNVM 1031 and the second eNVM 1032, and the non-volatile static random access memory 400 further includes a first control transistor CTRL1 and a second control transistor CTRL2.

The first eNVM 1031 is electrically connected to the first plate line PL1, and is electrically connected to the Q node Q1 through the first control transistor CTRL1, and is disposed between the first eNVM 1031 and the Q node Q1. The second eNVM 1032 is electrically connected to the second plate line PL2, electrically connected to the QB node Q2 through the second control transistor CTRL2, and is disposed between the second eNVM 1032 and the QB node Q2. In addition, the first plate line PL1 and the second plate line PL2 are electrically connected to each other. That is, the first plate line PL1 and the second plate line PL2 may be the same plate line, and may also be two plate lines electrically connected to each other. Through the structure of FIG. 4, in-memory computing and non-volatile characteristics may be realized, and the reliability of the eNVM may be improved.

Figure 5:
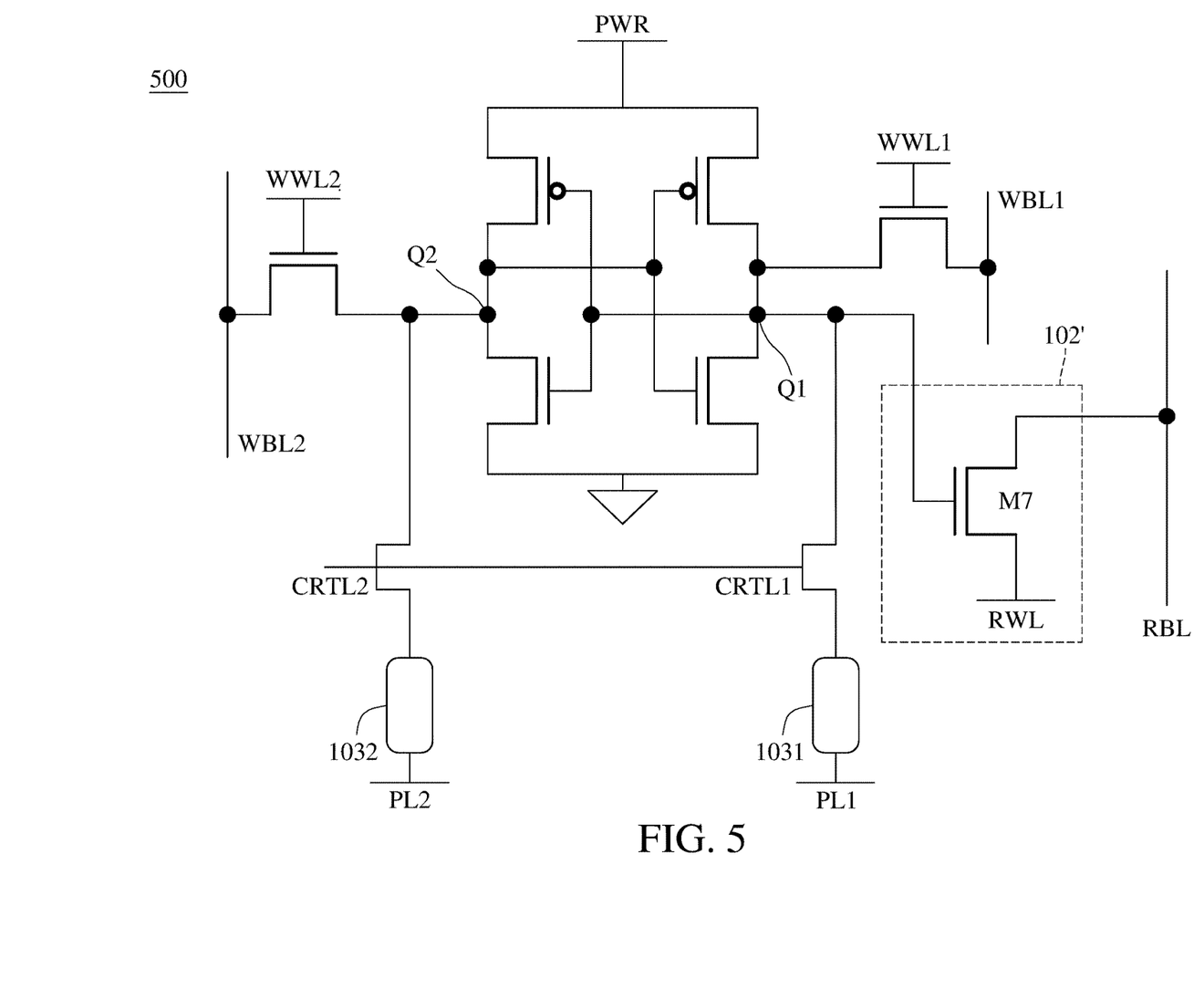
FIG. 5 is a structural circuit diagram illustrating a non-volatile static random access memory according to a fifth embodiment of the present disclosure.

Please refer to FIG. 5, wherein FIG. 5 is a structural circuit diagram illustrating a non-volatile static random access memory according to a fifth embodiment of the present disclosure. The structure of the non-volatile static random access memory 500 of FIG. 5 is approximately the same as the non-volatile static random access memory 400 of FIG. 4, the difference lies in that, the second reading transistor is omitted from the reading element 102' of the non-volatile static random access memory 500 of FIG. 5, and only includes the first reading transistor M7. The gate electrode of the first reading transistor M7 is electrically connected to the Q node Q1, the source electrode of the first reading transistor M7 is electrically connected to the read word line RWL, and the drain electrode of the first reading transistor M7 is electrically connected to the read bit line RBL. In other words, the source electrode and the drain electrode of the first reading transistor M7 are electrically connected to the read word line RWL and the read bit line RBL, respectively, and the gate electrode of the first reading transistor M7 and one terminal of the first control transistor CTRL1 are commonly electrically connected to the Q node Q1. Through the structure of FIG. 5, in-memory computing and non-volatile characteristics may be realized, and the reliability of the eNVM may be improved.

Figure 6:
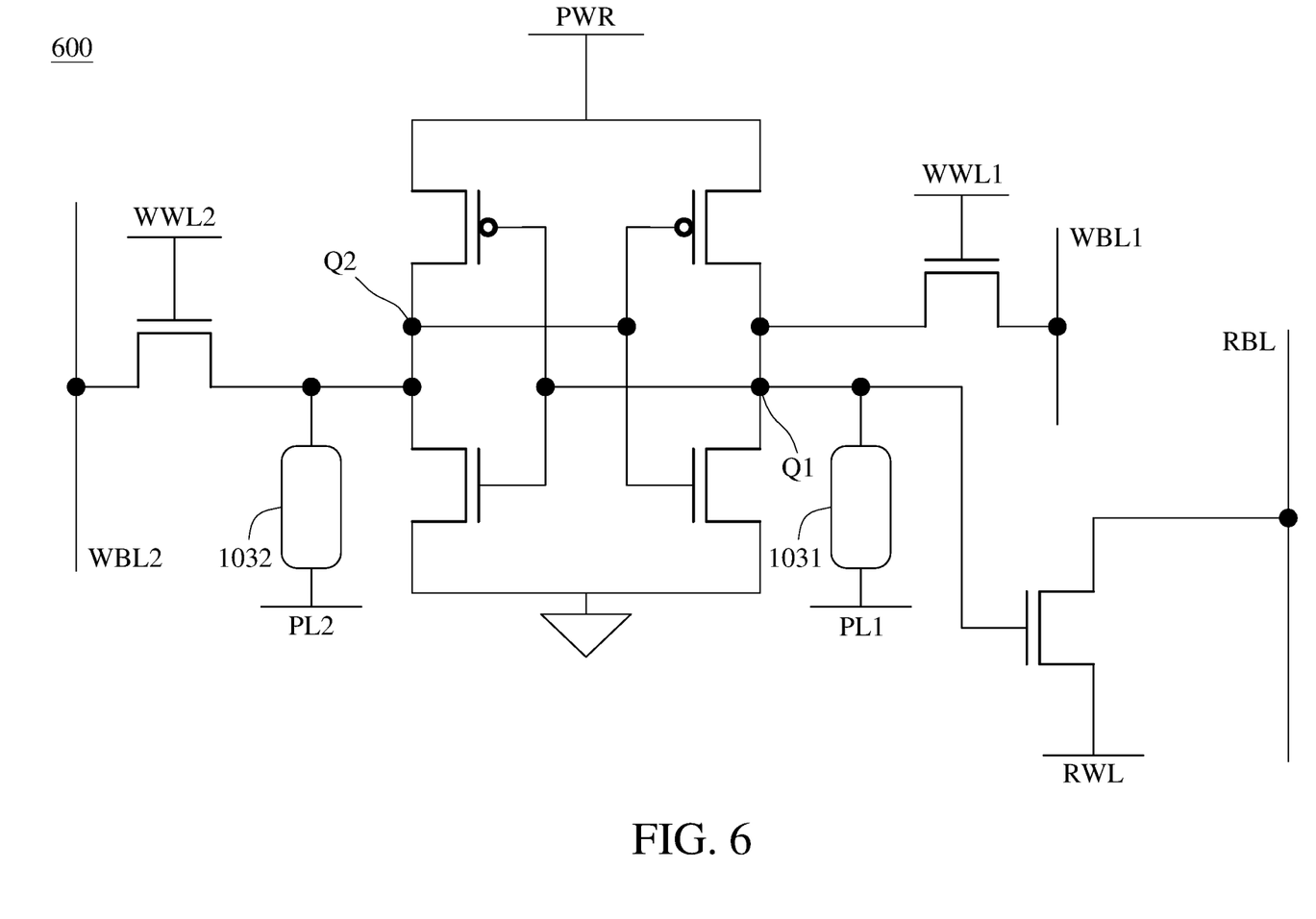
FIG. 6 is a structural circuit diagram illustrating a non-volatile static random access memory according to a sixth embodiment of the present disclosure.

Please refer to FIG. 6, wherein FIG. 6 is a structural circuit diagram illustrating a non-volatile static random access memory according to a sixth embodiment of the present disclosure. The structure of the non-volatile static random access memory 600 of FIG. 6 is approximately the same as the non-volatile static random access memory 500 of FIG. 5. That is, the non-volatile static random access memory 600 also includes the reading element 102' shown in FIG. 5, the difference lies in that, the first eNVM 1031 of the non-volatile static random access memory 600 of FIG. 6 is directly electrically connected to the Q node Q1, and the second eNVM 1032 is directly electrically connected to the QB node Q2. In other words, one terminal of the first eNVM 1031 is directly electrically connected to the Q node Q1, and the other terminal is electrically connected to the first plate line PL1; one terminal of the second eNVM 1032 is directly electrically connected to the QB node Q2, and the other terminal is electrically connected to the second plate line PL2. In addition, as described above, the first plate line PL1 and the second plate line PL2 are electrically connected to each other. Therefore, the one terminal of the first eNVM 1031 connected to the first plate line PL1 is also connected to the second plate line PL2, and the one terminal of the second eNVM 1032 connected to the second plate line PL2 is also connected to the first plate line PL1. Through the structure of FIG. 6, in-memory computing and non-volatile characteristics may be realized, and the overall size (volume) of the non-volatile static random access memory may be lowered.

Figure 7:
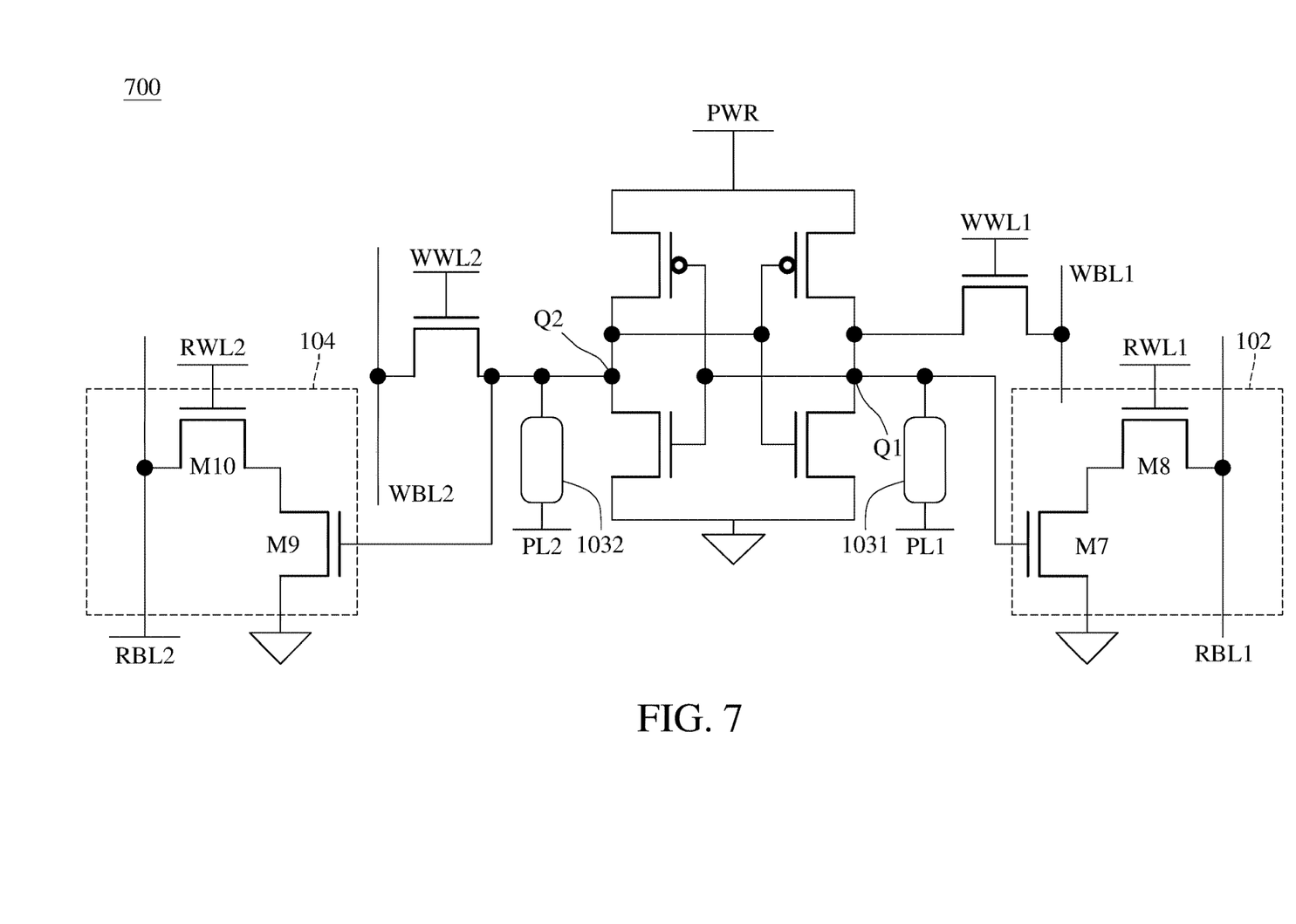
FIG. 7 is a structural circuit diagram illustrating a non-volatile static random access memory according to a seventh embodiment of the present disclosure.

Please refer to FIG. 7, wherein FIG. 7 is a structural circuit diagram illustrating a non-volatile static random access memory according to a seventh embodiment of the present disclosure. The non-volatile static random access memory 700 of FIG. 7 includes a first reading element 102 and a second reading element 104. The first reading element 102 includes the first reading transistor M7 and the second reading transistor M8, and the second reading element 104 includes a third reading transistor M9 and a fourth reading transistor M10.

The gate electrode of the first reading transistor M7 of the first reading element 102 is electrically connected to the Q node Q1, the drain electrode of the first reading transistor M7 is electrically connected to the source electrode of the second reading transistor M8, and the source electrode of the first reading transistor M7 is grounded. The gate electrode of the second reading transistor M8 is electrically connected to a first read word line RWL1, and the drain electrode of the second reading transistor M8 is electrically connected to a first read bit line RBL1.

The gate electrode of the third reading transistor M9 of the second reading element 104 is electrically connected to the QB node Q2, the drain electrode of the third reading transistor M9 is electrically connected to the source electrode of the fourth reading transistor M10, and the source electrode of the third reading transistor M9 is grounded. The gate electrode of the fourth reading transistor M10 is electrically connected to a second read word line RWL2, and the drain electrode of the fourth reading transistor M10 is electrically connected to a second read bit line RBL2.

One terminal of the first eNVM 1031 is electrically connected to the Q node Q1 and the gate electrode of the first reading transistor M7, and the other terminal of the first eNVM 1031 is electrically connected to the first plate line PL1. One terminal of the second eNVM 1032 is electrically connected to the QB node Q2 and the gate electrode of the third reading transistor M9, and the other terminal of the second eNVM 1032 is electrically connected to the second plate line PL2. In other words, one terminal of the first eNVM 1031 and the gate electrode of the first reading transistor M7 are commonly electrically connected to the Q node Q1, and one terminal of the second eNVM 1032 and the gate electrode of the third reading transistor M9 are commonly electrically connected to the QB node Q2. Through the structure of FIG. 7, in-memory computing and non-volatile characteristics may be realized.

Figure 8:
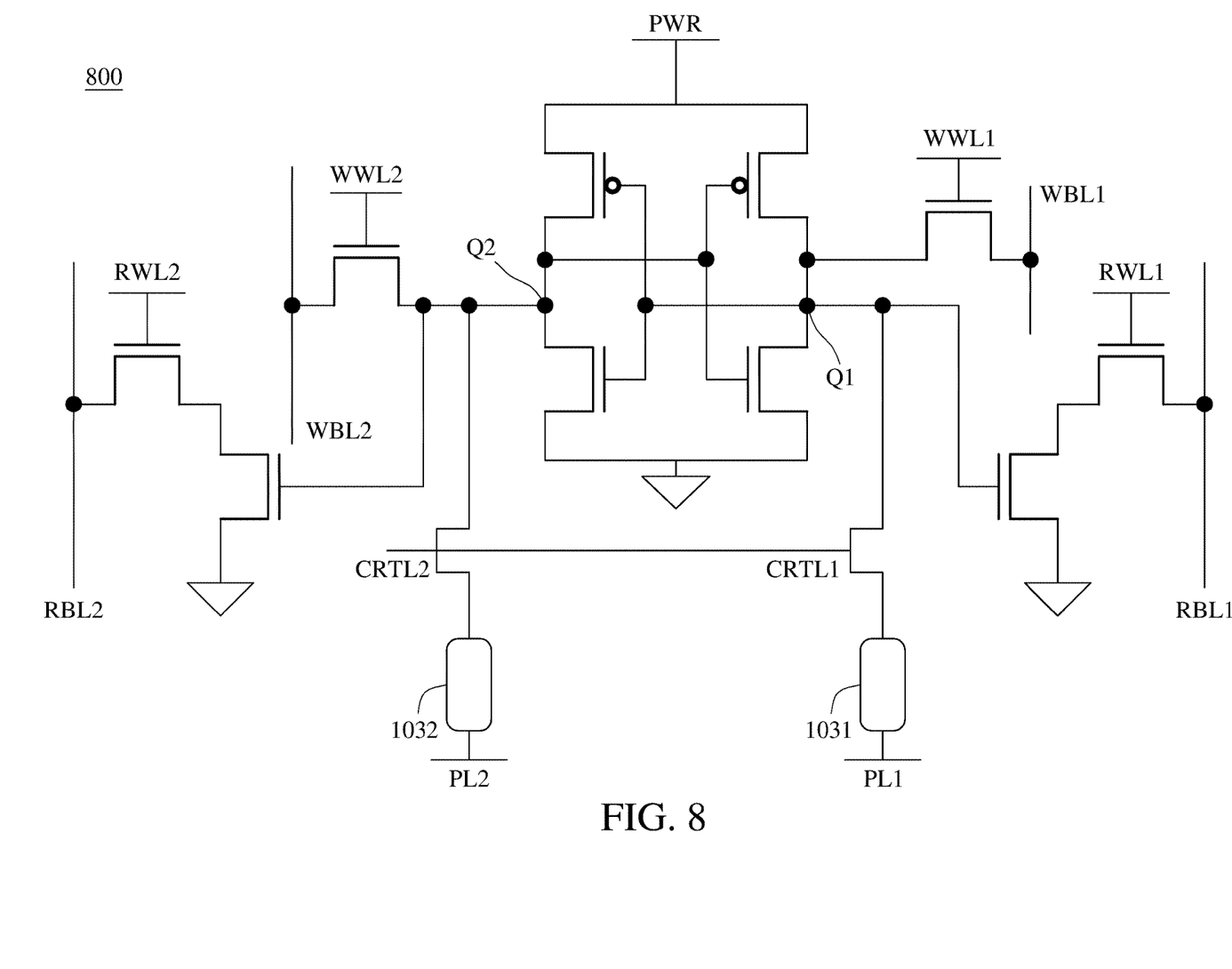
FIG. 8 is a structural circuit diagram illustrating a non-volatile static random access memory according to an eighth embodiment of the present disclosure.

Please refer to FIG. 8, wherein FIG. 8 is a structural circuit diagram illustrating a non-volatile static random access memory according to an eighth embodiment of the present disclosure. The structure of the non-volatile static random access memory 800 of FIG. 8 is approximately the same as the non-volatile static random access memory 700 of FIG. 7, the difference lies in that, the first eNVM 1031 of the non-volatile static random access memory 800 is electrically connected to the Q node Q1 through the first control transistor CTRL1, and the second eNVM 1032 is electrically connected to the QB node Q2 through the second control transistor CTRL2. In other words, one terminal of the first eNVM 1031 is connected to the first control transistor CTRL1, and the other terminal of the first eNVM 1031 is connected to the first plate line PL1; one terminal of the second eNVM 1032 is connected to the second control transistor CTRL2, and the other terminal of the second eNVM 1032 is connected to the second plate line PL2. Through the structure of FIG. 8, in-memory computing and non-volatile characteristics may be realized, and the reliability of the eNVM may be improved.

Figure 9:
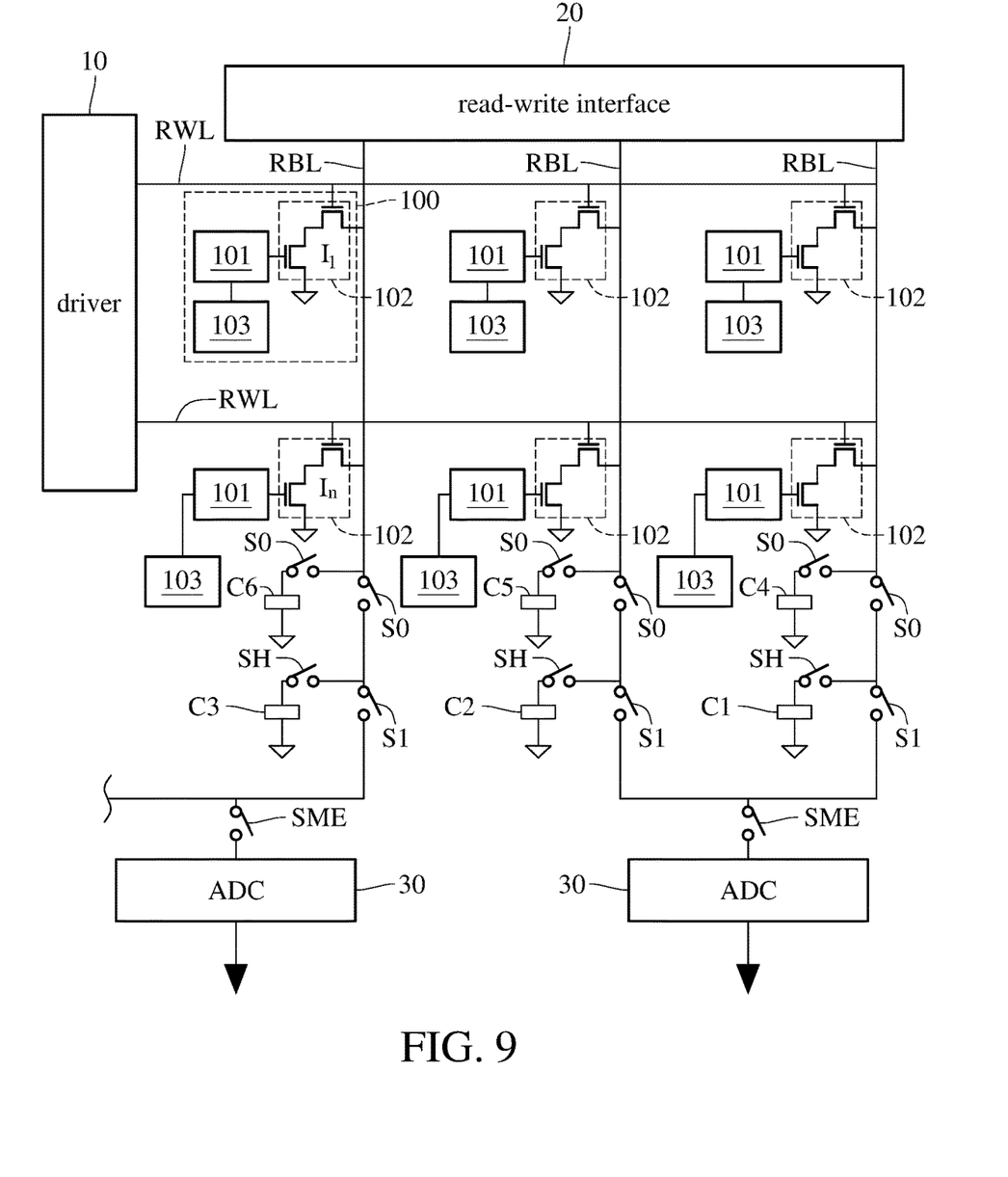
FIG. 9 is a schematic diagram illustrating a crossbar array formed with the non-volatile static random access memory according to one or more embodiments of the present disclosure.

Please refer to FIG. 9, wherein FIG. 9 is a schematic diagram illustrating a crossbar array formed with the non-volatile static random access memory according to one or more embodiments of the present disclosure. The crossbar array of FIG. 9 is formed with the non-volatile static random access memory 100 of the first embodiment, but the crossbar array may also be formed with the non-volatile static random access memory of any one of the second to eighth embodiments. The crossbar array includes a plurality of columns and a plurality of rows. In the example of FIG. 9, the crossbar array includes three columns and two rows, but the crossbar array may also have the structure of more than three columns (for example, as the break line shown in FIG. 9).

As shown in FIG. 9, the crossbar array is formed of the read word lines RWL in the first direction, the read bit lines RBL in the second direction and a plurality of non-volatile static random access memories 100 connected to the read word lines RWL and the read bit lines RBL. That is, each non-volatile static random access memory 100 is electrically connected to one read word line RWL and one read bit line RBL. The first direction may be a horizontal direction, the second direction may be a vertical direction, and the first direction may be perpendicular to the second direction.

Each of the read word lines RWL is electrically connected to a driver 10, for driving the non-volatile static random access memory 100 through the read word line RWL. In addition, the driver 10 may include a plurality of driving elements and a plurality of counters. Each row in FIG. 9 may be electrically connected to one driving element and one counter of the driver 10, for driving the non-volatile static random access memory 100 and calculating an address of each non-volatile static random access memory 100. Specifically, the driver 10 decodes the reading address, and outputs signal at the corresponding read word line RWL. Since the read word line RWL is usually relative long and has higher capacitance, the driver 10 is (preferably) able to provide greater current to drive the read word line RWL, for the voltage of the read word line RWL to rise in a short period of time. Each read bit line RBL is connected to a read-write interface 20, configured to control data reading or data writing of each non-volatile static random access memory 100 through the read bit line RBL.

In addition, as shown in FIG. 9, the crossbar array further includes an isolation switch SME. The isolation switch SME is electrically connected between binary weighted capacitors C1 to C3 and an analog to digital converter (ADC) 30, and is electrically connected between the compensation capacitors C4 to C6 and the ADC 30, wherein the ADC 30 may be a successive approximation register analog-to-digital converter (SAR ADC). When the ADC 30 performs conversion, the isolation switch SME is closed (turned on), and when the ADC 30 does not perform conversion, the isolation switch SME is opened (turned off).

The ADC 30 may be of any type such as differential ADC, Flash ADC etc. Furthermore, the ADC 30 comprises of a comparator, digital to analog converter (DAC) and successive approximation register (SAR) control logic. A comparator is a circuit that is used to compare the voltage across its terminals and outputs a digital output value of zero if the voltage across its negative terminal is higher than positive terminal and digital output value one if the voltage across the positive terminal is greater than negative terminal. DAC takes n-bit digital data as input from the SAR control logic and gives an analog voltage output proportional to the value of the digital input data given as input. SAR control logic is based on binary search algorithm, that determines the digital output value of the most significant bit (MSB) using comparator and then the next significant bit and the next till it reaches the least significant bit (LSB). Initially the sampled voltage of the read bit line (RBL) is compared with the voltage of the DAC and digital output value is determined. This digital output value from the comparator is then used by the SAR control logic to modify the output voltage of the DAC. The new modified voltage of the DAC is then compared with the sampled voltage of the read bit line RBL held from the previous step to determine the digital output value of the next significant bit to be either one or zero. This value is then used by SAR control logic to modify the output voltage of DAC and the process continues till all the n-bits of the SAR ADC are filled with ones or zeros by the comparator.

The capacitors C1 to C6 shown in FIG. 9 are designed for a capacitance sum of each column being the same. For example, take FIG. 9 as an example, a capacitance sum of the capacitor C1 and the capacitor C4 equals to a capacitance sum of the capacitor C2 and the capacitor C5, and equals to a capacitance sum of the capacitor C3 and the capacitor C6. When the ADC 30 performs analog-to-digital conversion, all the switches SH and S0 are first closed, and all the isolation switches SME and switches S1 are opened, for the read-write interface 20 to allow the read bit line RBL and the capacitors C1 to C6 to perform precharge operation simultaneously. The precharge operation is stopped after charging to the maximum voltage level, and the read word line RWL opens (turned off) the transistor 100 for the read bit line RBL and the capacitors C1 to C6 to perform discharge operation, wherein the final voltages of the read bit line RBL and the capacitors C1 to C6 after the discharge operation depend on a weighted sum of the values of the read word line and the static random access memory of the column. At this time, the switch S0 is opened, the switch S1 is closed. After the switch S1 is closed, the capacitor C1 and the capacitor C2 are connected, and the final equilibrium voltage is proportional to the total charge, and is also proportional to the sum of the products of capacitance value (the capacitor C1 or C2) and voltage of each row. Lastly, the isolation switch SME is opened, and said charge is turned into a digital value with multiple bits by the ADC 30.

It should be noted that, the capacitance values of the capacitors C1 to C3 are associated with bit address. For example, assuming that the bit address of the capacitor C1 is the lowest bit and the bit address of the capacitor C2 is the second lowest bit, then a ratio of the capacitance value of the capacitor C1 and the capacitance value of the capacitor C2 may be 1:2. In other embodiments, the number of connected capacitors may be greater than two to represent binary value with more than two bits, and during which, the capacitance values of each bit address is twice that of the adjacent lower bit address.

The voltage drop on the read bit line due to the vector matrix multiplication operation is the charge shared between binary weighted capacitors C1 to C3 and compensation capacitors C4 to C6 using switches S0, S1 and SH, to use binary weighted charge distribution to implement multi-bit weights. The shared binary weighted charge is then transferred to the ADC 30 to realize the output of the vector matrix multiplication, wherein in the example of FIG. 9, the output of the ADC 30 is 4 bits. In other words, in the crossbar array of FIG. 9, the output of each row is 4 bits. To reduce static power consumption, the content stored in the static random access memory 101 is stored into the eNVM 103 (eg, a ferroelectric capacitor) before the voltage on the power PWR line is turned off. Then, when the voltage on the power PWR line is restored again and pulled up to the working voltage Vdd, the data is restored from the eNVM 103 and stored back to the static random access memory 101. After the data is restored back into the SRAM 101, the vector matrix multiplication operation of the data may be realized for intermittent computing needs thus saving power and time to restore the data.

In addition, the number of rows and columns shown in FIG. 9 is only an example. In one embodiment, the crossbar array may be an array of five rows and five columns, and this array is also connected to the ADC 30 through the isolation switch SME. The present disclosure does not limit the number of rows and columns of the crossbar array.

Figure 10:
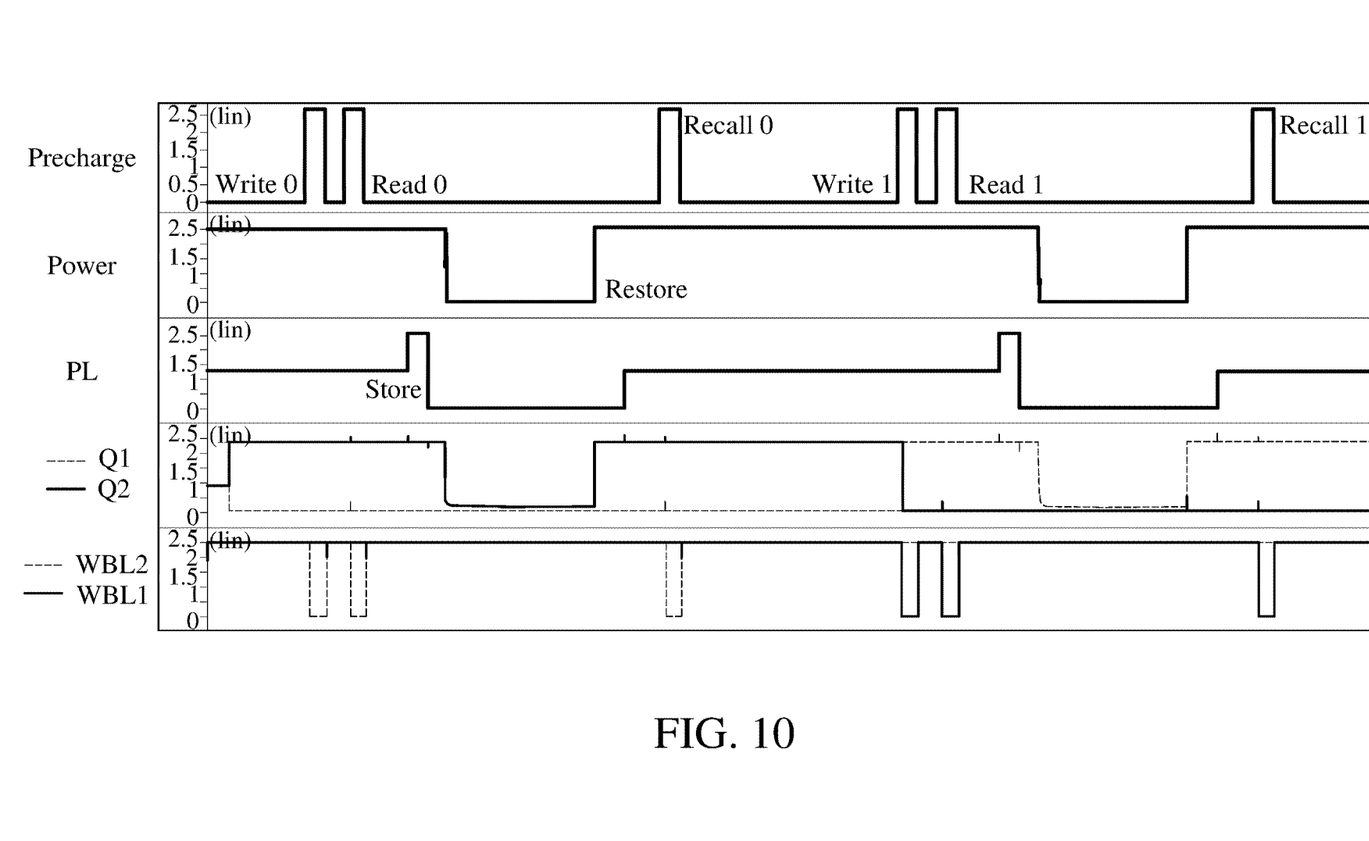
FIG. 10 is a schematic diagram illustrating data storage and data restoration of the non-volatile static random access memory according to one or more embodiments of the present disclosure.

Please refer to FIG. 10, wherein FIG. 10 is a schematic diagram illustrating data storage and data restoration of the non-volatile static random access memory according to one or more embodiments of the present disclosure. The example in FIG. 10 uses a simulation program with integrated circuit emphasis.

Before turning off the power, the voltage of the plate line is pulsed from ½ of the working voltage (Vdd/2) to the working voltage (Vdd), and then lowered to the ground voltage to store data. Then, the power is restored from the ground voltage to the working voltage (Vdd). As shown in the simulation results of FIG. 10, both the binary data 1 and 0 can be successfully stored and restored to the Q-node of the non-volatile static random access memory.

Figure 11:
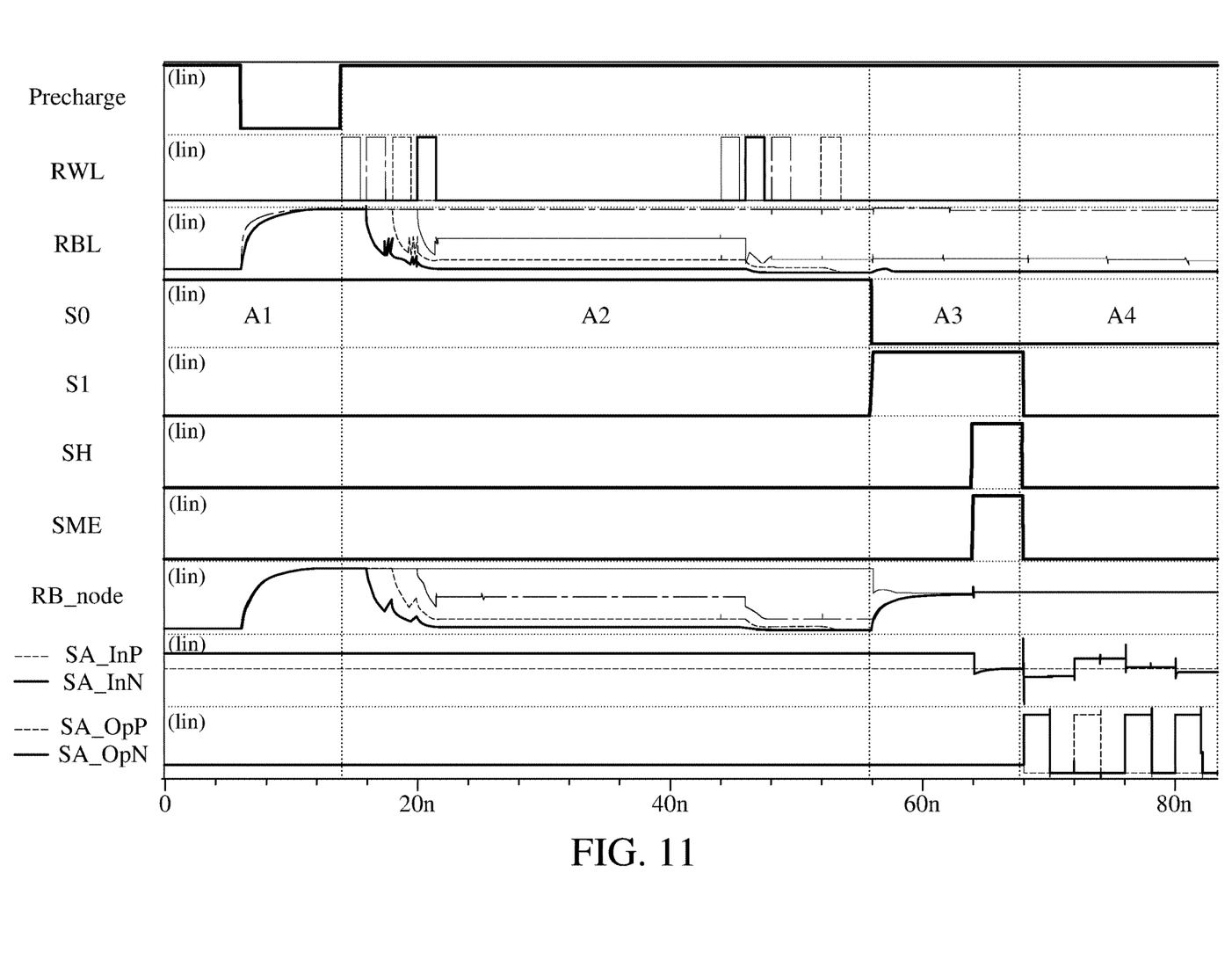
FIG. 11 illustrates outputs of vector matrix multiplication (VMM) implemented by using simulation program with integrated circuit emphasis (SPICE).

Please refer to FIG. 11, wherein FIG. 11 illustrates outputs of vector matrix multiplication (VMM) implemented by using simulation program with integrated circuit emphasis (SPICE), and also uses the crossbar array of FIG. 9 as an example. The simulation of FIG. 11 may be categorized into four stages, which are the first stage A1 of precharging, the second stage A2 of in-memory operation and sampling, the third stage A3 of charge sharing, and the fourth stage A4 of ADC enabling.

Please also refer to FIG. 9, as described above, the isolation switch SME is the isolation switch between the capacitors C1 to C6 and the ADC 30. When the ADC 30 is performing conversion, the isolation switch SME is closed (turned on), and when the ADC 30 is not performing conversion, the isolation switch SME is opened (turned-off). In FIG. 11, RB_node represents the voltage of the read bit line RBL from the switch S1 to the ADC 30; SA_InP and SA_InN represent the voltages of the positive input terminal and the negative input terminal of the differential amplifier of the ADC 30, respectively; and SA_OpP, SA_OpN represent the voltages of the positive output terminal and the negative output terminal of the differential amplifier of the ADC 30, respectively.

As shown in FIG. 11, in the first stage A1, the read bit line RBL is precharged. Then, in the second stage A2, the voltage of the read bit line RBL is discharged according to the data, the number of pulses, the pulse width and the voltage at the Q node Q1 through the pulse on the read word line RWL. In the third stage A3, the residual charge on the capacitors of the read bit line RBL is converted into a binary weighted charge distribution by using binary weighted capacitors C1 to C3 and the compensation capacitors C4 to C6 and the switches S0, S1 and SH. In the fourth stage A4, the shared charge representing the multi-bit weight vector matrix multiplication is then transmitted to the ADC 30 (e.g., SAR ADC) to implement the output of the vector matrix multiplication into digital form.

In view of the above description, by electrically connecting at least one eNVM to the static random access memory, the static random access memory according to one or more embodiments of the present disclosure may store and restore the data instantly from the eNVM devices. In-memory computation is realized after the restoration of the data to the SRAM from the eNVM device using reading element, thus preventing the von Neumann bottleneck situation. In addition, non-volatile characteristics may be realized, and the control transistors may improve the reliability of the eNVM. Therefore, the non-volatile static random access memory may be prevented from encountering the von Neumann bottleneck situation, and static power consumption of intermittent computing devices may be lowered. In addition, by giving excitation to the terminal of the eNVM connecting the plate line, data may be stored and restored instantly. Since data storage and data restoration are performed in parallel, static power consumption and memory writing time may be further reduced.

What is claimed is:

1. A non-volatile static random access memory, comprising:
    a static random access memory comprising a first inverter, a second inverter and two transistors, an output terminal of the first inverter and an input terminal of the second inverter are electrically connected to each other to serve as a Q node, an input terminal of the first inverter and an output terminal of the second inverter are electrically connected to each other to serve as a QB node, and the two transistors are electrically connected to the Q node and the QB node, respectively;

a reading element electrically connected to the Q node, wherein the reading element comprises a first reading transistor and a second reading transistor, a gate electrode of the first reading transistor is electrically connected to the Q node, a source electrode of the second reading transistor is electrically connected to a drain electrode of the first reading transistor, a gate electrode of the second reading transistor is electrically connected to a read word line, and a drain electrode of the second reading transistor is electrically connected to a read bit line; and a first embedded non-volatile memory electrically connected to the QB node.

2. The non-volatile static random access memory according to claim 1, further comprising a second embedded non-volatile memory electrically connected to the Q node.

3. The non-volatile static random access memory according to claim 2, further comprising:

a first control transistor electrically connected to the first embedded non-volatile memory and the QB node, and disposed between the first embedded non-volatile memory and the QB node; and a second control transistor electrically connected to the second embedded non-volatile memory and the Q node, and disposed between the second embedded non-volatile memory and the Q node.

4. A non-volatile static random access memory, comprising:

a static random access memory comprising a first inverter, a second inverter and two transistors, an output terminal of the first inverter and an input terminal of the second inverter are electrically connected to each other to serve as a Q node, an input terminal of the first inverter and an output terminal of the second inverter are electrically connected to each other to serve as a QB node, and the two transistors are electrically connected to the Q node and the QB node, respectively;

a reading element electrically connected to the Q node, wherein the reading element comprises a first reading transistor, the first reading transistor comprises a gate electrode, a source electrode and a drain electrode, the gate electrode is electrically connected to the Q node, the source electrode is electrically connected to a read word line, and the source electrode is electrically connected to a read bit line; and a first embedded non-volatile memory electrically connected to the QB node.

5. The non-volatile static random access memory according to claim 1, wherein the reading element is a first reading element, the read word line is a first read word line, the read bit line is a first read bit line, and the non-volatile static random access memory further comprises a second reading element, wherein the second reading element comprises a third reading transistor and a fourth reading transistor, a gate electrode of the third reading transistor is electrically connected to the QB node, a source electrode of the fourth reading transistor is electrically connected to a drain electrode of the third reading transistor, a gate electrode of the fourth reading transistor is electrically connected to a second read word line, and a drain electrode of the fourth reading transistor is electrically connected to a second read bit line.

6. The non-volatile static random access memory according to claim 1, wherein the first embedded non-volatile memory is electrically connected to the QB node through a control transistor.

* * * * *